United States Patent [19]

Hirano

[11] Patent Number: 5,495,199
[45] Date of Patent: Feb. 27, 1996

[54] SWITCHED CAPACITOR CIRCUIT

[75] Inventor: Tetsuo Hirano, Nukata, Japan

[73] Assignee: Nippondenso Co., Ltd., Kariya, Japan

[21] Appl. No.: 309,499

[22] Filed: Sep. 23, 1994

Related U.S. Application Data

[63] Continuation of Ser. No. 922,481, Jul. 31, 1992, abandoned.

[30] Foreign Application Priority Data

Aug. 2, 1991 [JP] Japan ................................. 3-194505

[51] Int. Cl.$^6$ .................................................. H03K 17/16
[52] U.S. Cl. ........................ 327/337; 327/554; 327/379; 327/437; 307/109
[58] Field of Search ................................. 307/491, 572, 307/585, 109; 327/337, 554, 362, 379, 389, 437

[56] References Cited

U.S. PATENT DOCUMENTS 4,446,390  5/1984  Alaspa ..................... 307/585
4,467,225  8/1984  Tanaka ..................... 307/296 A
4,611,135  9/1986  Nakayama ................. 307/585
4,803,382  2/1989  Tanimoto et al. ......... 307/491

FOREIGN PATENT DOCUMENTS 58-198918  11/1983  Japan .
63-27114   4/1988   Japan .

Primary Examiner—William M. Shoop, Jr.
Assistant Examiner—Peter Ganjoo
Attorney, Agent, or Firm—Cushman, Darby & Cushman

[57] ABSTRACT

A switched capacitor circuit includes a capacitor, a MOS switch and a timing generating circuit. The MOS switch is connected with the capacitor in series for discharging electric charges which are charged into the capacitor. The MOS switch includes a plurality of MOS transistors which are parallelly connected with each other. The timing generating circuit generates timing signals to the MOS switch so that the MOS transistors are turned on one after another in response to each timing signal. Sampling noise is reduced because an ON-state resistance of the MOS switch is transiently high.

14 Claims, 5 Drawing Sheets

SWITCHED CAPACITOR CIRCUIT

This is a continuation of application Ser. No. 07/922,481, filed on Jul. 31, 1992, which was abandoned.

BACKGROUND OF THE INVENTION

1. Field of the Invention

The present invention relates to a switched capacitor circuit which is preferably used in a filter circuit and the like.

2. Description of the Related Art

FIG. 8 shows an example of a conventional switched capacitor type integrator which includes a switched capacitor circuit. This integrator is composed of a capacitor 50, four analog switches 51, 52, 53 and 54, an operational amplifier 55 and a capacitor 56 for integration.

The analog switches 51, 52, 53 and 54 are respectively C-MOS (Complementary-MOS) transistors shown in FIG. 9. The analog switches 52 and 53 are turned on or off in response to a clock signal Φ1 shown in FIG. 10, and the analog switches 51 and 54 are turned on or off in response to a clock signal Φ2.

Electric charges are charged into the capacitor 50 when the analog switches 51 and 54 are turned on in response to the clock signal Φ2. The electric charges are then transferred into the capacitor 56 when the analog switches 52 and 53 are turned on in response to the clock signal Φ1. At that time sampling noise shown in FIG. 10 is generated at an output terminal Vout.

In order to reduce such a sampling noise, an improved SCF (Switched Capacitor Filter) shown in FIG. 11 is proposed in Japanese patent application laid-open No. 58-198918. The definition of the SCF includes the above-mentioned switched capacitor type integrator. The output of the SCF 57 is connected with a low-pass filter 58, such as an RC active filter, to reduce the sampling noise.

However, according to the SCF shown in FIG. 11, additional electronic elements, namely a resistor, a capacitor and an operational amplifier or the like are necessary to compose the low-pass filter 58. Since the resistor and the capacitor occupy the large area, they cannot be generally built in a monolithic integrated circuit in which the SCF is to be formed, and, therefore, are forced to be externally formed in the area other than the integrated circuit. When they are externally formed, manufacturing cost of a whole circuit comes to be raised.

SUMMARY OF THE INVENTION

Accordingly, it is an object of the present invention to provide a switched capacitor circuit which reduces the sampling noise without the low-pass filter which enlarges the size of the entire circuit.

To accomplish the foregoing and other objects, the switched capacitor circuit of the present invention includes a capacitor, a MOS switch and a timing generating circuit. The MOS switch is connected with the capacitor for discharging electric charges which are charged into the capacitor. The MOS switch comprises a plurality of MOS transistors which are parallelly connected with each other. The timing generating circuit generates a plurality of timing signals to the MOS switch so that the MOS transistors are turned on one after another in response to each timing signal.

Structure of the MOS switch will be explained in detail with reference to FIG. 6 showing an example using a C-MOS transistor. Each of gate electrodes of the C-MOS transistor is divided among m areas of small gate electrodes. Widths of the small gate electrodes are respectively Wp1, Wp2, ... Wpm, and Wn1, Wn2, ... Wnm. Total widths Wp (=Wp1+Wp2 ... +Wpm) and Wn (=Wn1+Wn2+... Wnm) keep constant. When timing signals shown in FIG. 7 are applied to the small gate electrodes, each timing signal is delayed by a predetermined delay time Td so that small C-MOS transistors are turned on one after another with the delay time Td.

Since an ON-state resistance of the MOS switch is transiently high, according to the present invention, sampling noise is reduced.

BRIEF DESCRIPTION OF THE DRAWINGS

The features of the present invention that are believed to be novel are set forth with particularity in the appended claims. The invention, together with the objects and advantages thereof, may best be understood by reference to the following description of the presently preferred embodiments together with the accompanying drawings in which:

DESCRIPTION OF THE PREFERRED EMBODIMENT

The preferred embodiment of the present invention will now be described with reference to the drawings.

Figure 1:
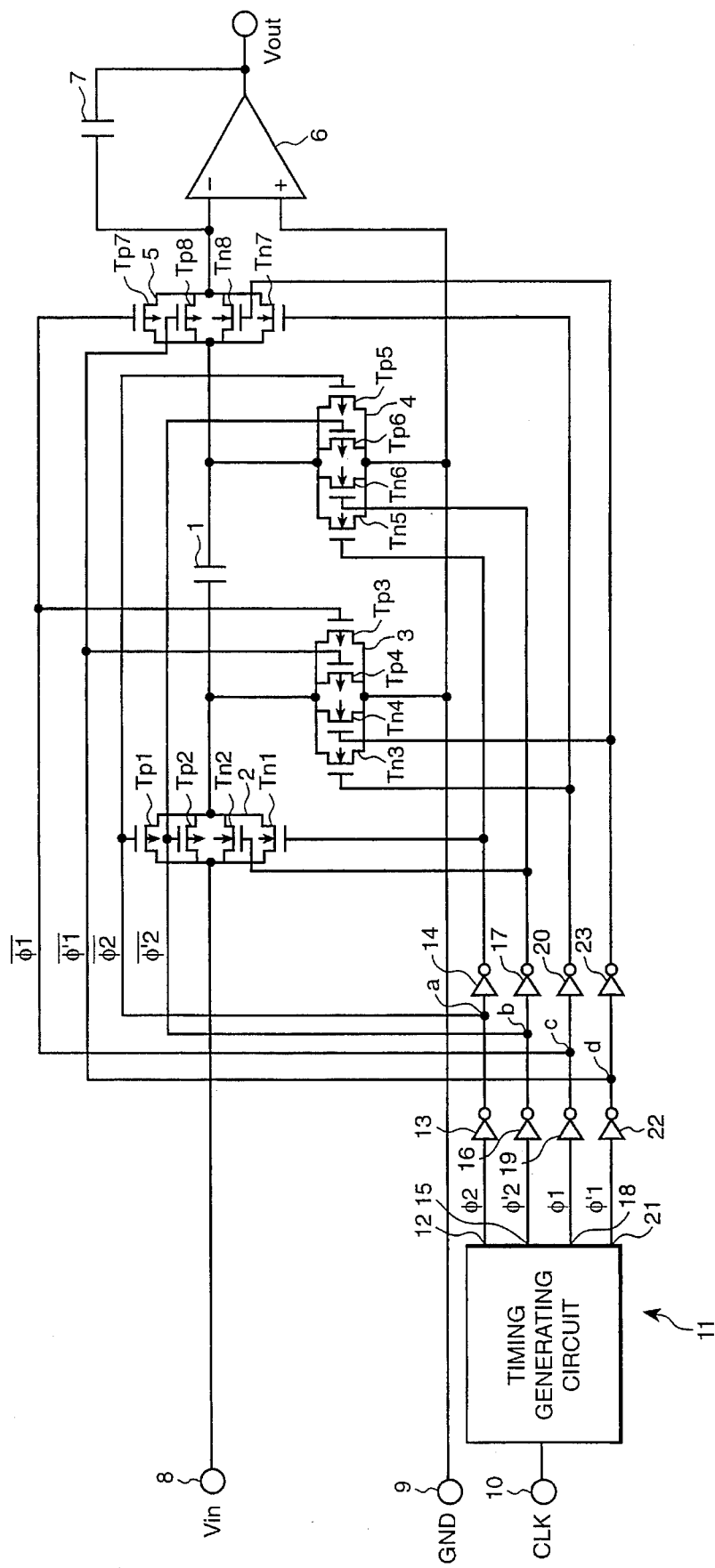
FIG. 1 is an electric circuit diagram of a switched capacitor type integrator according to a first embodiment of the present invention.

FIG. 1 shows a switched capacitor type integrator of a first embodiment. The integrator comprises a capacitor 1, C-MOS analog switches 2, 3, 4 and 5, an operational amplifier 6 and a capacitor 7 for integration.

Each of the C-MOS analog switches 2, 3, 4 and 5 includes two pairs of C-MOS transistors. The two pairs of C-MOS transistors are parallelly connected with each other. More specifically, the C-MOS analog switch 2 has a first and second C-MOS transistors. The first C-MOS transistor comprises a P-type MOS transistors Tp1 and an N-type MOS transistor Tn1, and the second C-MOS transistor comprises a P-type MOS transistor Tp2 and an N-type MOS transistor Tn2. The C-MOS analog switch 3 has a third and fourth C-MOS transistors. The third C-MOS transistor comprises a P-type MOS transistor Tp3 and an N-type MOS transistor Tn3, and the fourth C-MOS transistor comprises a P-type MOS transistor Tp4 and an N-type MOS transistor Tn4. The C-MOS analog switch 4 has a fifth and sixth C-MOS transistors. The fifth C-MOS transistor comprises a P-type MOS transistor Tp5 and an N-type MOS transistor Tn5, and the sixth C-MOS transistor comprises a P-type MOS transistor Tp6 and an N-type MOS transistor Tn6. The C-MOS analog switch 5 has a seventh and eighth C-MOS transistors. The seventh C-MOS transistor comprises a P-type MOS transistor Tp7 and an N-type MOS transistor Tn7, and the eighth C-MOS transistor comprises a P-type MOS transistor Tp8 and an N-type MOS transistor Tn8.

Gate width of each of the two C-MOS transistors which compose the C-MOS analog switch is half as wide as total gate width to be needed in design.

A signal input terminal 8 is connected to an input-side electrode of the capacitor 1 through the C-MOS analog switch 2. An output-side electrode of the capacitor 1 is connected to an inverting input terminal of the operational amplifier 6 through the C-MOS analog switch 5. An output terminal of the operational amplifier 6 is connected to the inverting input terminal through the capacitor 7.

A ground terminal 9 is connected to the input-side electrode of the capacitor 1 through the C-MOS analog switch 3 and connected to the output-side electrode of the capacitor 1 through the C-MOS analog switch 4, and also connected to a noninverting input terminal of the operational amplifier 6.

A clock terminal 10 is connected to a timing generating circuit 11. An output terminal 12 of the timing generating circuit 11 is connected to the gate electrodes of the transistors Tn1 and Tn5 through inverters 13 and 14. A connecting point A between inverters 13 and 14 is connected to gate electrodes of the transistors Tp1 and Tp5. An output terminal 15 is connected to gate electrodes of the transistors Tn2 and Tn6 through inverters 16 and 17. A connecting point B between inverters 16 and 17 is connected to gate electrode of the transistors Tp2 and Tp6. An output terminal 18 is connected to gate electrodes of the transistors Tn3 and Tn7 through inventors 19 and 20. A connecting point C between inverters 19 and 20 is connected to gate electrodes of the transistors Tp3 and Tp7. An output terminal 21 is connected to gate electrodes of the transistors Tn4 and Tn8 through inverters 22 and 23. A connecting point D between inverters 22 and 23 is connected to gate electrodes of the transistors Tp4 and Tp8.

Figure 2:
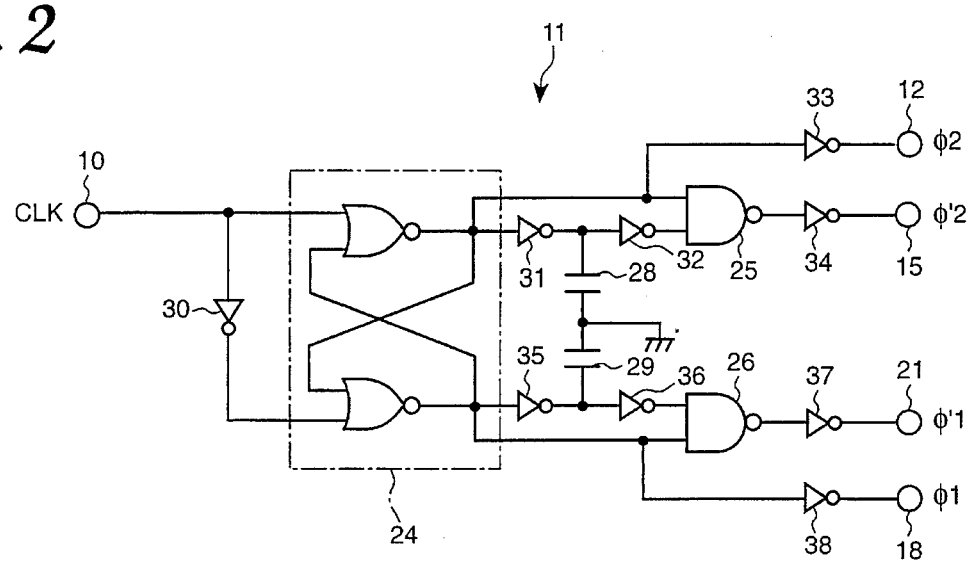
FIG. 2 is an electric circuit diagram of a timing generating circuit of the integrator shown in FIG. 1.

FIG. 2 shows a concrete structure of the timing generating circuit 11. The timing generating circuit 11 is composed of a flip-flop circuit 24, NAND circuits 25 and 26, capacitors 28 and 29, and inverters 30, 31, 32, 33, 34, 35, 36, 37 and 38.

A clock pulse is inputted from the clock terminal 10 into the flip-flop circuit 24 directly and is simultaneously inputted into the flip-flop circuit 24 through the inverter 30. One of output signals of the flip-flop circuit 24 is transferred to the output terminal 12 through the inverter 33 and is simultaneously transferred to the output terminal 15 through the inverters 31 and 32, the NAND circuit 25 and the inverter 34. A connecting point between the inverters 31 and 32 is grounded through the capacitor 28. The other of output signals of the flip-flop circuit 24 is transferred to the output terminal 18 through the inverter 38 and is simultaneously transferred to the output terminal 21 through the inverters 35 and 36, the NAND circuit 26 and the inverter 37. A connecting point between the inverters 35 and 36 is grounded through the capacitor 29.

Clock signals Φ1, Φ'1, Φ2 and Φ'2 are outputted from the output terminals 18, 21, 12 and 15 respectively. These clock signals Φ1, Φ'1, Φ2 and Φ'2 are changed into antiphase clock signals $\overline{\Phi1}$, $\overline{\Phi'1}$, $\overline{\Phi2}$ and $\overline{\Phi'2}$ by the inverters 19, 22, 13 and 16 respectively as shown in FIG. 1.

Figure 3:
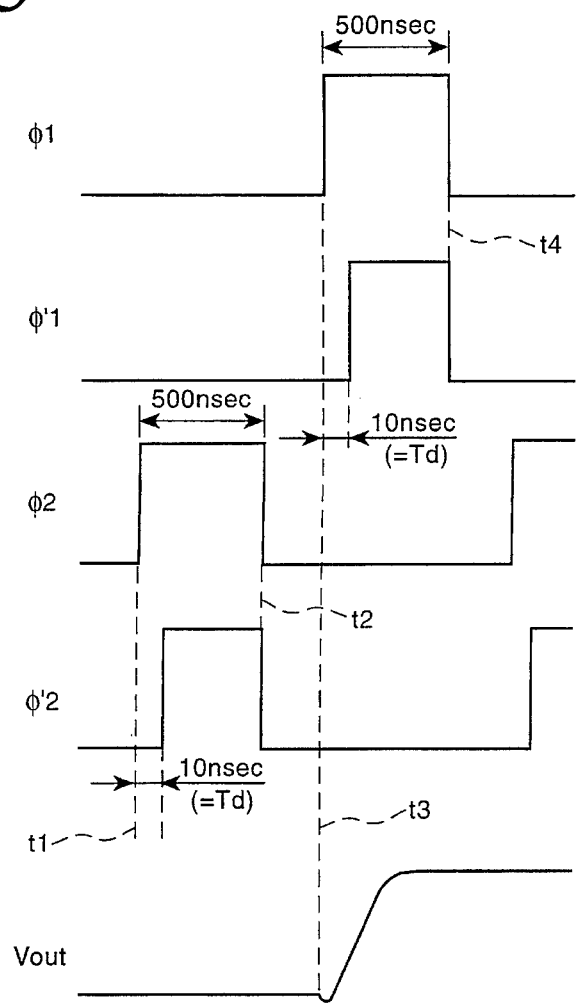
FIG. 3 is a timing chart showing timing of clock signals for analog switches shown in FIG. 1.

The clock signal Φ'1 is delayed by a predetermined delay time Td as compared with the clock signal Φ1 as shown in FIG. 3. The clock signal Φ'2 is also delayed by the predetermined delay time Td as compared with the clock signal Φ2. In this case, the delay time Td is 10 nanosecond, for example, and on-state period of the clock signals Φ1 and Φ2 is 500 nanosecond. It is noted that the delay time Td can be adjusted by changing time constant of the condensers 28 and 29 shown in FIG. 2.

Operation of the above-mentioned switched capacitor type integrator will be described hereinafter.

When the clock signal Φ2 rises at time t1, or in other words, the clock signal $\overline{\Phi2}$ falls, both the first C-MOS transistor (Tn1 and Tp1) of the C-MOS analog switch 2 and the fifth C-MOS transistor (Tn5 and Tp5) of the C-MOS analog switch 4 are turned on. Then, when the clock signal Φ'2 rises after the delay time Td passed, or in other words, the clock signal $\overline{\Phi'2}$ falls, both the second C-MOS transistor (Tn2 and Tp2) of the C-MOS analog switch 2 and the sixth C-MOS transistor (Tn6 and Tp6) of the C-MOS analog switch 4 are also turned on. Consequently, an input signal Vin inputted from the signal input terminal 8 is sampled in a way that electric charges are charged in the capacitor 1.

Then, the C-MOS analog switches 2 and 4 are turned off at time t2.

Then, when the clock signal Φ1 rises at time t3, or in other words, the clock signal $\overline{\Phi1}$ falls, both the third C-MOS transistor (Tn3 and Tp3) of the C-MOS analog switch 3 and the seventh C-MOS transistor (Tn7 and the Tp7) of the C-MOS analog switch 5 are turned on. Then, when the clock signal Φ'1 rises after the delay time Td passed, or in other words, the clock signal $\overline{\Phi'1}$ falls, both the fourth C-MOS transistor (Tn4 and Tp4) of the C-MOS analog switch 3 and the eighth C-MOS transistor (Tn8 and Tp8) of the C-MOS analog switch 5 are turned on. Consequently, as the electric charges charged in the capacitor 1 are transferred to the capacitor 7, an output signal Vout is changed stepwise.

The input signal Vin is transferred to the output terminal in accordance with a transfer function of the above-mentioned switched capacitor circuit by cyclically repeating the above-mentioned operation.

According to the integrator of the present embodiment, one of the C-MOS transistors of the C-MOS analog switch is first turned on, and the other of the C-MOS transistors is then turned on after a predetermined time delay. An ON-state resistance of the C-MOS analog switch is controlled cyclically in such a manner that it becomes relatively high for the transient period of the C-MOS analog switch. Therefore, the sampling noise is reduced because the electric charges are limited to rapidly move through the C-MOS analog switch for the transient period. It is noted that, as the delay time Td is kept short, such as 10 nanosecond, there is minimal affect upon the operation speed of the integrator.

Figure 11:
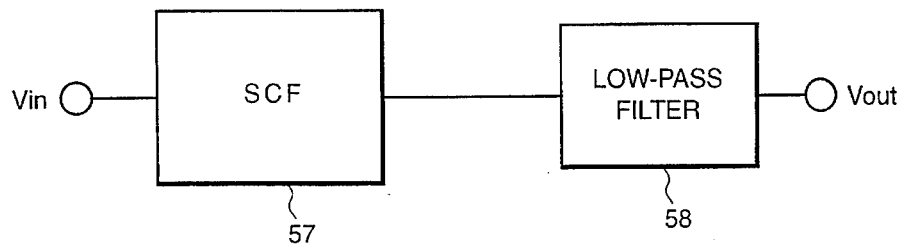
FIG. 11 is a block diagram of a SCF furnished with a low-pass filter.

Moreover, the integrator of the present embodiment reduces the sampling noise without additional electronic elements such as the resistor, the capacitor and the operational amplifier used in the low-pass filter 58 shown in FIG. 11. Therefore, as the number of components of the circuit dose not increases or minimally increase at the most, it is possible to build all of the components into a monolithic integrated circuit.

Figure 4:
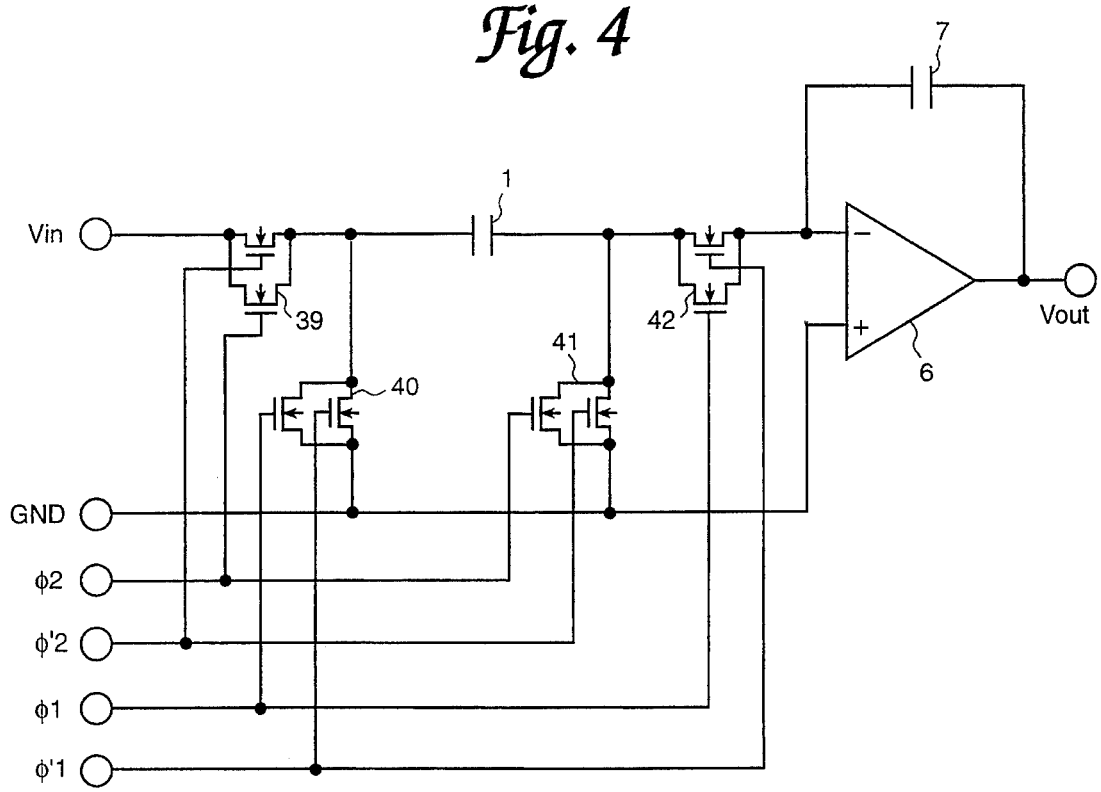
FIG. 4 is an electric circuit diagram of a switched capacitor type integrator according to a second embodiment of the present invention.
Figure 5:
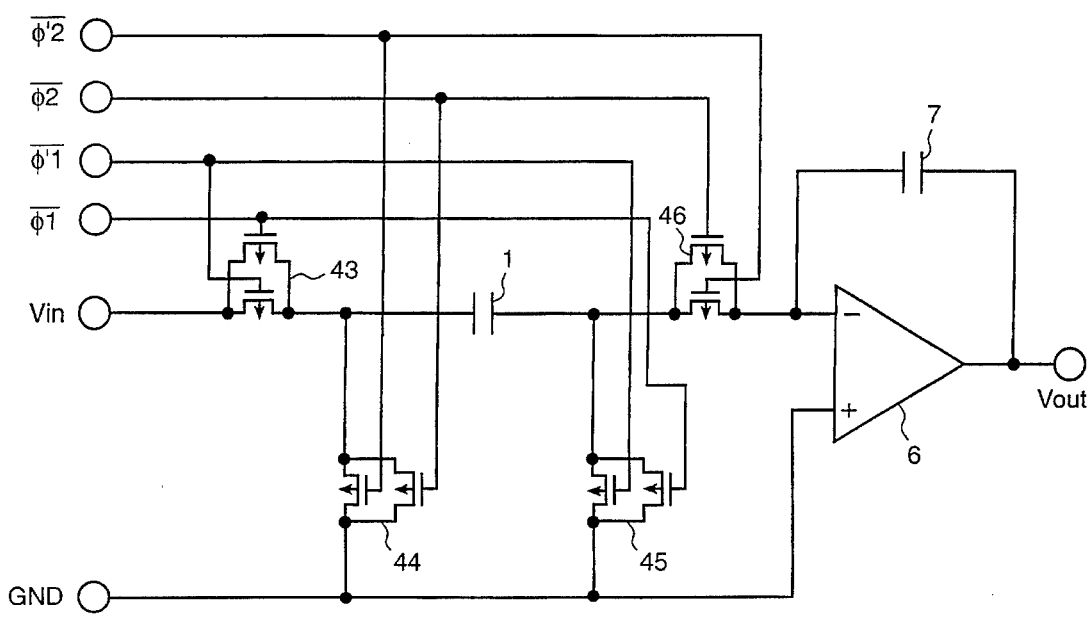
FIG. 5 is an electric circuit diagram of a switched capacitor type integrator according to a third embodiment of the present invention.
Figure 6:
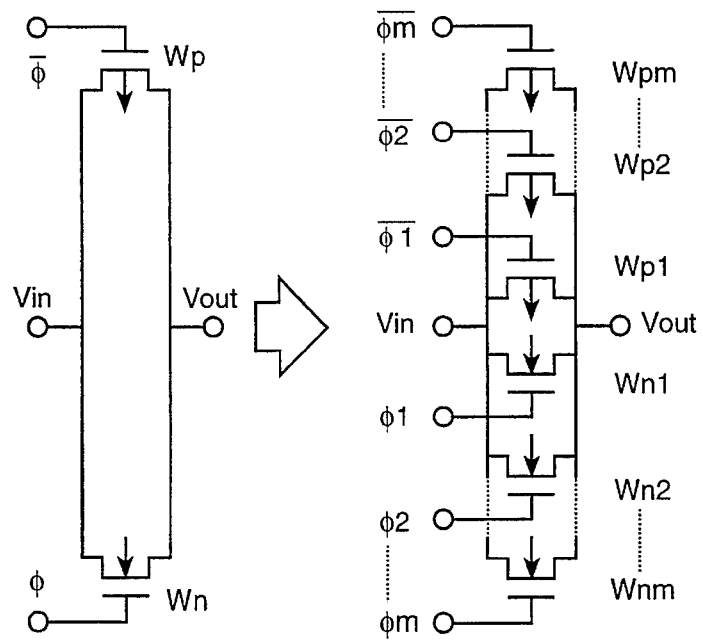
FIG. 6 is a diagram for explaining an analog switch of the present invention.
Figure 7:
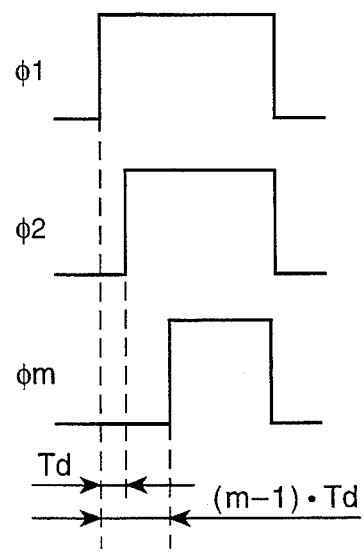
FIG. 7 is a timing chart showing timing of clock signals shown in FIG. 6.
Figure 8:
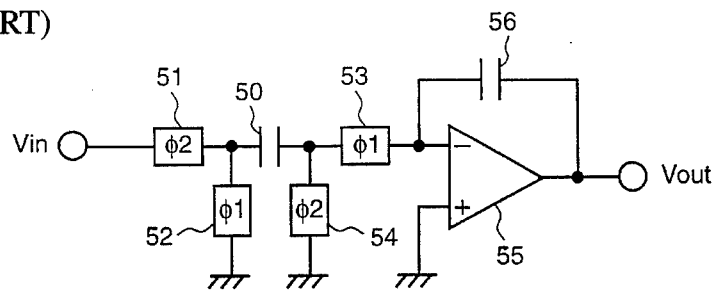
FIG. 8 is an electric circuit diagram of a conventional switched capacitor type integrator.
Figure 9:
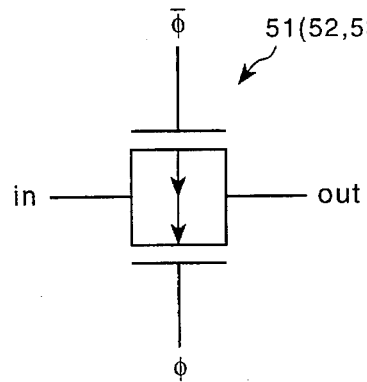
FIG. 9 is a diagram for explaining analog switches shown in FIG. 8.
Figure 10:
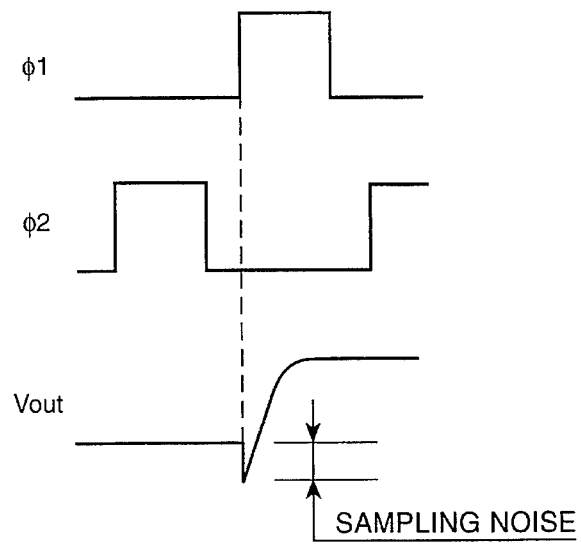
FIG. 10 is a timing chart showing timing of clock signals for the analog switches shown in FIGS. 8 and 9.

In the above-mentioned first embodiment, the C-MOS transistors have been used as analog switches. However, the analog switches may be replaced by N-type MOS switches or P-type MOS switches. FIG. 4 shows a switched capacitor type integrator according to a second embodiment. N-type MOS switches 39, 40, 41, and 42 are respectively used in place of the C-MOS analog switches 2, 3, 4 and 5 of FIG. 1. Each of the N-type MOS switches 39, 40, 41 and 42 is composed of two N-type MOS transistors which are parallelly connected with each other. FIG. 5 shows a switched capacitor type integrator according to a third embodiment. P-type MOS switches 43, 44, 45 and 46 are respectively used in place of the C-MOS analog switches 2, 3, 4 and 5 of FIG. 1. Each of the P-type MOS switches 43, 44, 45 and 46 is composed of two P-type MOS transistors which are parallelly connected with each other. In FIGS. 4 and 5, like numerals in the corresponding figures indicate similar elements.

In the above-mentioned embodiments, the analog switch is divided into two pairs of MOS transistors. However, the number of the divided MOS transistors may be more than two.

In the above-mentioned embodiments, the gate widths of the MOS transistors are all same in size. However, they may be different. In this case, it is desirable to first turn on the MOS transistor which has a relatively narrow gate width and then turn on the MOS transistor which has a relatively wide gate width in order to effectively reduce the sampling noise. If a MOS transistor having too wide a gate width is turned on, additional noise is generated by the transistor. Therefore, the gate width of the transistor needs to be designed so as not to generate such a noise.

Furthermore, in the above-mentioned first embodiment, all four C-MOS analog switches 2-5 have two pairs of C-MOS transistor respectively, the two pairs of C-MOS transistor being parallelly connected with each other. However, only two C-MOS analog switches 3 and 5, which are used for discharging electric charges from the capacitor 1, may have two pairs of C-MOS transistor, and the other C-MOS analog switches 2 and 4 may have only one C-MOS transistor respectively.

The switched capacitor circuit according to the present invention may be used in a filter circuit, an oscilator, an A/D converter, or the like.

The present invention has been described with reference to the above-mentioned embodiments, but the present invention is not limited to these embodiments and can be modified without departing from the spirit or concept of the present invention.

What is claimed is:

1. A switched capacitor circuit comprising:

a capacitor for storing electric charges;

MOS switching means for discharging said electric charges, said MOS switching means having a predetermined gate width and including a plurality of MOS transistors connected in parallel with each other, each transistor having a specific gate width, wherein said predetermined gate width is divided among said specific gate widths of said plurality of MOS transistors such that a sum of said specific gate widths corresponds to said predetermined gate width; and timing generating means for cyclically generating a plurality of predetermined timing signals to turn on said plurality of MOS transistors one after another for increasing an on-state resistance of said MOS switching means at a transient period thereof when said MOS switching means is turned on, and to turn off said plurality of MOS transistors simultaneously when said MOS switching means is turned off.

2. A switched capacitor circuit according to claim 1, wherein each of said plurality of MOS transistors are complementary-type. MOS transistors.

3. A switched capacitor circuit according to claim 1, wherein each of said plurality of MOS transistors are N-type MOS transistors.

4. A switched capacitor circuit according to claim 1, wherein each of said plurality of MOS transistors are P-type MOS transistors.

5. A switched capacitor circuit according to claim 1, wherein said timing generating means is connected with gate electrodes of said MOS transistors so as to output said timing signals to said gate electrodes.

6. A switched capacitor circuit according to claim 5, wherein said timing generating means inputs a clock pulse therein, and outputs clock signals to said gate electrodes, at least one of said clock signals being delayed by a predetermined time to rise as compared with the others.

7. A switched capacitor circuit according to claim 1, wherein each of said gate widths of said MOS transistors are equal in size.

8. A switched capacitor circuit according to claim 1, wherein said capacitor, said MOS switch and said timing generating means are built in a monolithic integrated circuit.

9. A switched capacitor circuit comprising:

a capacitor for storing electric charges;

a charging circuit for charging said capacitor, said charging circuit including:

a first MOS switch device, said first MOS switch device having a first predetermined gate width and including a plurality of MOS transistors, each transistor having a specific gate width, said transistor being connected in parallel with each other, wherein said predetermined gate width is divided among said specific gate widths of said plurality of MOS transistors such that a sum of said specific gate widths corresponds to said predetermined gate width;

a discharging circuit for discharging said capacitor, said discharging circuit including:

a second MOS switch device, said second MOS switch device having a second predetermined gate width and including a plurality of MOS transistors, each transistor having said specific gate width and connected in parallel with each other, wherein a number of said MOS transistors included in said second MOS switch device is the same as a number of said MOS transistors included in said first MOS switch device; and timing generating means for cyclically generating a plurality of predetermined timing signals to control said first MOS switch device for charging said capacitor so as to turn on said plurality of MOS transistors included in said first MOS switch device in a first sequential order and so as to turn off said plurality of MOS transistors included in said first MOS switch device simultaneously, and to control said second MOS switch device for discharging said capacitor so as to turn on said plurality of MOS transistors included in said second MOS switch device in a second sequential order and so as to turn off said plurality of MOS transistors included in said second MOS switch device simultaneously.

10. A switched capacitor circuit according to claim 9, wherein each of said plurality of MOS transistors included in said first MOS switch device and said second MOS switch device are complementary type MOS transistors.

11. A switched capacitor according to claim 9, wherein gate widths of each said plurality of MOS transistors included in said first MOS switch device and said second MOS switch device have a same size.

12. A switch capacitor circuit according to claim 9, further comprising:

an integrator connected to said discharging circuit, said integrator including an operational amplifier and a feedback impedance comprising another capacitor.

13. A switched capacitor circuit comprising:

a capacitor;

a charging circuit for charging said capacitor, said charging circuit including:
a first MOS switch device including two complementary MOS transistors connected in parallel, and
a second MOS switch device including two complementary MOS transistors connected in parallel;

a discharging circuit for discharging said capacitor, said discharging circuit including:
a third MOS switch device including two complementary MOS transistors connected in parallel, and
a fourth MOS switch device including two complementary MOS transistors connected in parallel, wherein said complementary MOS transistor included in said first, second, third and fourth MOS switch devices have a same size gate width; and timing generating means for cyclically generating a plurality of predetermined timing signals to sequentially turn on said complementary MOS transistors included in said first and said second MOS switch devices for charging said capacitor, to turn off said complementary MOS transistors included in said first and said second MOS switch devices simultaneously, to turn on said complementary MOS transistors included in said third and fourth MOS switch devices for discharging said capacitor, to turn off said complementary MOS transistors included in said third and fourth MOS switch devices simultaneously.

14. A switch capacitor circuit according to claim 13, further comprising:

an integrator connected to said discharging circuit, said integrator including an operational amplifier and a feedback impedance comprising another capacitor.

\* \* \* \* \*